(12) United States Patent
Lee

(10) Patent No.: US 11,829,064 B2
(45) Date of Patent: Nov. 28, 2023

(54) EUV LIGHTING DEVICE USING MULTILAYER REFLECTION ZONE PLATE AND MANUFACTURING METHOD THEREOF

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 0 days.

(21) Appl. No.: 17/570,404

(22) Filed: Jan. 7, 2022

(65) Prior Publication Data

US 2023/0079858 A1    Mar. 16, 2023

(30) Foreign Application Priority Data

Sep. 10, 2021   (KR) .................. 10-2021-0120836

(51) Int. Cl.
  *G03F 1/24*   (2012.01)
  *G03F 7/20*   (2006.01)
  *G03F 7/00*   (2006.01)

(52) U.S. Cl.
  CPC ............ *G03F 1/24* (2013.01); *G03F 7/70033* (2013.01)

(58) Field of Classification Search
  CPC .... G03F 1/24; G03F 7/70033; G03F 7/70141; G03F 7/70158; G03F 7/702; G03F 7/70575; G03F 7/70975; G03F 1/84; G03F 7/70891; G03F 1/62; G03F 7/70616; G03F 7/70825; G03F 1/22; G03F 7/2004; G03F 7/70166; G03F 7/70308; G03F 7/70591; G02B 17/06; G02B 26/0833; G02B 5/09; G02B 5/1876; G01N 21/84; G03B 27/42; G03B 27/52; B82Y 10/00; G01J 1/0437; G01J 1/429; G21K 1/06; G21K 2201/068
  See application file for complete search history.

(56) References Cited

U.S. PATENT DOCUMENTS

| 11,561,467 | B1 * | 1/2023 | Lee .................. G03F 1/62 |
| 2004/0057107 | A1 * | 3/2004 | Yun ............... G02B 27/4211 |
| | | | 359/365 |
| 2004/0165165 | A1 * | 8/2004 | Yun .................. G03F 1/84 |
| | | | 378/34 |
| 2007/0139777 | A1 * | 6/2007 | Williams ......... G02B 5/1876 |
| | | | 359/201.1 |

(Continued)

FOREIGN PATENT DOCUMENTS

| KR | 10-1258344 B1 | 4/2013 |
| KR | 10-1370203 B1 | 3/2014 |

(Continued)

*Primary Examiner* — Deoram Persaud
(74) *Attorney, Agent, or Firm* — Revolution IP, PLLC

(57) ABSTRACT

An EUV lighting device for metrology and inspection of an EUV mask in an EUV exposure process of a semiconductor device manufacturing process includes: an EUV light source for outputting EUV light with a wavelength ranging from 5 nm to 15 nm; and a multilayer reflection zone plate having an EUV reflection multilayer film, which is a planar substrate, and a zone plate pattern. The EUV lighting device radiates EUV light output from the EUV light source to the multilayer reflection zone plate, acquires $1^{st}$ diffraction light reflected, and creates EUV illumination light.

11 Claims, 9 Drawing Sheets

(56) References Cited

U.S. PATENT DOCUMENTS

| | | | |
|---|---|---|---|
| 2009/0284725 A1* | 11/2009 | Soer | G02F 1/061 |
| | | | 355/67 |
| 2013/0161543 A1* | 6/2013 | Park | G02B 5/1857 |
| | | | 250/550 |
| 2015/0002925 A1 | 1/2015 | Endres et al. | |
| 2018/0284600 A1* | 10/2018 | Steigerwald | G06F 30/39 |
| 2020/0003685 A1* | 1/2020 | Jeon | G01N 21/95623 |
| 2021/0136901 A1* | 5/2021 | Chang | G03F 7/70616 |
| 2022/0107568 A1* | 4/2022 | Johnson | G02B 27/4222 |
| 2022/0167492 A1* | 5/2022 | Na | G02B 5/0891 |
| 2022/0392660 A1* | 12/2022 | Lebert | G21K 7/00 |
| 2023/0121748 A1* | 4/2023 | Lee | G03F 1/84 |
| | | | 250/372 |

FOREIGN PATENT DOCUMENTS

| | | |
|---|---|---|
| KR | 10-1606227 B1 | 3/2016 |
| KR | 10-2021-0043701 A | 4/2021 |

\* cited by examiner

EUV LIGHTING DEVICE USING MULTILAYER REFLECTION ZONE PLATE AND MANUFACTURING METHOD THEREOF

BACKGROUND OF THE INVENTION

Field of the Invention

The present invention relates to an EUV lighting device and a manufacturing method thereof using a multilayer reflection zone plate, and more particularly, to an EUV lighting device and a manufacturing method thereof using a multilayer reflection zone plate for a metrology and inspection system of an EUV blank mask used for forming a fine pattern using an EUV exposure process during a semiconductor device manufacturing process.

Background Art

Recently, an EUV exposure machine for manufacturing a semiconductor device using EUV light with a wavelength of 13.5 nm has been introduced into a semiconduction manufacturing process. The EUV exposure machine uses a wavelength shorter than the existing ArF exposure machine having a wavelength of 193 nm so as to be advantageous for miniaturization of the device. It is expected that an EUV exposure machine or a beyond EVU (called a BUV) exposure machine with a wavelength of about 6.7 nm which is advantageous for further miniaturization using a shorter wavelength will be introduced into a semiconductor manufacturing process.

The EUV exposure machine having the shorter wavelength than the existing EUV exposure machine is an EUV mask using a blank mask to form a fine pattern. The EUV mask has a structure different from that of the existing ArF exposure machine. That is, the EUV mask has not a transmission structure but a reflection structure, and has reflectivity optimized to a wavelength of 13.5 nm or a wavelength of 6.7 nm (in the case of BUV).

There are lots of metrology and inspection systems using EUV light during an EUV mask manufacturing process. Especially, a defect inspection of an EUV blank mask pattern using an EUV inspection system is a key process which directly has an influence on a wafer yield because defects of the blank mask are all repeatedly transferred to a wafer.

The defect pattern detected through the mask inspection can be corrected through a correction process, and success or failure can be confirmed by a method of confirming through SEM review after directly exposing to a wafer using a wafer exposure machine. However, because it takes a lot of time and money, in the current mask manufacturing process, the confirming method is applied to previously verify the influence of a pattern on the wafer at low cost utilizing a mask inspection device of a microscopic structure which can emulate a wafer exposure optical system.

FIG. 1 is a configuration diagram of an EUV lighting device 1 according to a conventional art. US Patent Publication No. 2015-0002925 discloses EUV lighting technology. In the EUV lighting technology, a collector mirror collects EUV light, and the collected EUV light is transferred to an illumination adjusting optical system. The illumination adjusting optical system has two facet optical devices having mirror arrays to adjust intensity distribution according to an incidence angle of beam applied to a sample, and two EUV mirrors to finally illuminate the sample. The conventional EUV lighting device requires lots of development expenses of the illumination optical system and is very difficult to manufacture and install required components since at least five EUV optical components are applied.

As described above, the conventional technology requires a lot of optical components, is complicated in structure, requires increased expenses, and is difficult in maintenance.

PATENT LITERATURE

Patent Documents

Patent Document 1: US Patent Publication No. 2015-0002925, Korean Patent No. 10-1370203

Patent Document 2: Korean Patent Publication No. 10-2021-0043701, Korean Patent No. 10-1258344, Korean Patent No. 10-1606227

SUMMARY OF THE INVENTION

Accordingly, the present invention has been made to solve the above-mentioned problems occurring in the prior arts, and it is an object of the present invention to provide a high-performance EUV lighting device which can emulate an illuminator of an exposure machine onto a mask inspection device of a microscopic structure.

Especially, it is another object of the present invention to provide an EUV lighting device and a manufacturing method thereof, which can emulate freeform pupil illumination of an EUV exposure machine or provide uniform illumination beam required in an EUV inspection system by adjusting a duty cycle of a pattern or the height of an absorber by a position on a multilayer reflection zone plate.

To accomplish the above object, according to the present invention, there is provided an EUV lighting device for metrology and inspection of an EUV mask in an EUV exposure process of a semiconductor device manufacturing process including: an EUV light source for outputting EUV light with a wavelength ranging from 5 nm to 15 nm; and a multilayer reflection zone plate having an EUV reflection multilayer film, which is a planar substrate, and a zone plate pattern. The EUV lighting device radiates EUV light output from the EUV light source to the multilayer reflection zone plate, acquires $1^{st}$ diffraction light reflected, and creates EUV illumination light.

Moreover, the multilayer reflection zone plate includes: one planar substrate; an EUV reflection multilayer film stacked on the planar substrate; and a zone plate pattern formed on the surface or the inner face of the EUV reflection multilayer film.

Furthermore, the EUV reflection multilayer film is formed by at least two or more reflective materials stacked repeatedly. The zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

Additionally, an EUV reflection multilayer film is formed on the planar substrate, and the zone plate pattern is formed on the surface or the inner face of the EUV reflection multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

In addition, the absorber for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

The zone plate pattern adjusts $1^{st}$ light intensity by adjusting the height or width (duty cycle) of the absorber, and adjusts beam intensity distribution by angles by spatially adjusting intensity of $1^{st}$ light in the multilayer reflection zone plate.

Moreover, the multilayer reflection zone plate has a zone plate pattern of a circular or oval shape. The multilayer reflection zone plate is an off-axis zone plate that the center of the circular or oval pattern does not exist in the multilayer reflection zone plate or is an on-axis zone plate that the center of the circular or oval pattern exists in the multilayer reflection zone plate. In the case of the off-axis zone plate, the center of zeroth light and the center of first light head in different directions, and in the case of the on-axis zone plate, the center of zeroth light and the center of first light are in the same direction.

The EUV lighting device further includes an aperture which additionally radiates monochromatic light around the illumination beam output from the multilayer reflection zone plate or restricts an area of the illumination beam.

Furthermore, the zone plate pattern embodies binary illumination when the multilayer reflection zone plate determines whether or not diffraction of light exists by spatially adjusting whether or not a zone plate pattern exists on the multilayer reflection zone plate.

Additionally, the zone plate pattern embodies freeform pupil illumination or pixelated pupil illumination when a duty cycle of a zone plate pattern or the height of absorber is spatially adjusted on the multilayer reflection zone plate so as to spatially adjust intensity of $1^{st}$ diffraction light.

In addition, in another aspect of the present invention, in order to output illumination light by reflecting EUV light output from a EUV light source, there is provided a manufacturing method of an extreme ultraviolet (EUV) lighting device for metrology and inspection of an EUV mask used in an EUV exposure process of a semiconductor device manufacturing process comprising the steps of: manufacturing a multilayer reflection zone plate having an EUV reflection multilayer film and a zone plate pattern formed on one planar substrate; and repeatedly stacking at least two or more reflective materials on the EUV reflection multilayer film, wherein the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

Additionally, an EUV reflection multilayer film is formed on the planar substrate, and the zone plate pattern is formed on the surface or the inner face of the EUV reflection multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

Moreover, on the multilayer reflection zone plate, the absorber for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

Furthermore, the zone plate pattern adjusts $1^{st}$ light intensity by adjusting the height or width (duty cycle) of the absorber, and adjusts beam intensity distribution by angles by spatially adjusting intensity of $1^{st}$ light in the multilayer reflection zone plate.

Additionally, such a zone plate is utilized in determining whether or not diffraction of light exists by spatially adjusting whether or not a zone plate pattern exists on the multilayer reflection zone plate so as to embody binary illumination. The duty cycle at the place where the zone plate pattern exists is varied to control the quantity of light at the binary illumination position, so that the position to which illumination is lighted and intensity of light of illumination can be adjusted so as to provide desired illumination to a desired part.

The multilayer reflection zone plate according to the present invention is easily applicable to a device since being smaller in number of components than the existing optical system using mirrors, and has a short development period of time and requires low expenses since being small in number of components.

Because the reflection zone plate not to which the existing oblique incidence reflection zone plate parts are applied does not have the multilayer film, beam is injected into the zone plate at oblique incidence (at an incidence angle of 86 degrees) for soft ray reflection and solid angles collected to the zone plate are small. Therefore, the present invention can solve the problem that light harvesting efficiency is deteriorated.

Additionally, the EUV lighting device to which the multilayer reflection zone plate is applied can greatly increase light harvesting efficiency since injecting light to the zone plate at angles close to vertical angles, for example, at an incidence angle of about 6 degrees, and can increase light harvesting efficiency in a large area in the case of incoherent light sources which spread widely since a multilayer film which is a reflector is formed on a thick substrate to be capable of having a large area.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, an extreme ultraviolet (EUV) lighting device and a manufacturing method thereof using a multilayer reflection zone plate according to the present invention will be described in detail with reference to the accompanying drawings.

The EUV lighting device for metrology and inspection of an EUV mask in an EUV exposure process of a semiconductor device manufacturing process includes: an EUV light source for outputting EUV light with a wavelength ranging from 5 nm to 15 nm; and a multilayer reflection zone plate having an EUV reflection multilayer film, which is a planar substrate, and a zone plate pattern. EUV illumination light is created by obtaining $1^{st}$ diffraction light reflected after radiating EUV light output from the EUV light source to the multilayer reflection zone plate.

The EUV lighting device according to the present invention uses the multilayer reflection zone plate. The EUV lighting device includes the EUV light source and the multilayer reflection zone plate.

An EUV exposure machine for manufacturing semiconductor chips needs to uniformly radiate light to an EUV mask in a wide area, and uses the existing lighting technology which can secure a wide exposure area even though an expensive complicated optical system is applied since there are lots of demanded wafer output per unit time. However, if the EUV lighting technology used in the EUV exposure machine is applied to an EUV mask inspection device, an equipment development period is extended, equipment development expenses are increased, and a technical risk in equipment development is increased. Fortunately, because the output of the EUV mask is much less than the wafer output, the EUV inspection device lights a narrow area in the EUV mask, inspects the area using a magnifying optical system, and a method of scanning and inspecting the EUV mask at high speed is applied.

The EUV light generated from the light source collects $1^{st}$ light by the multilayer reflection zone plate. The zone plate has a circular or oval pattern in order to diffract light, diffracts EUV light in the reflection direction after being combined with the multilayer film which can reflect EUV light, and collects the $1^{st}$ light of the EUV light.

Figure 1:
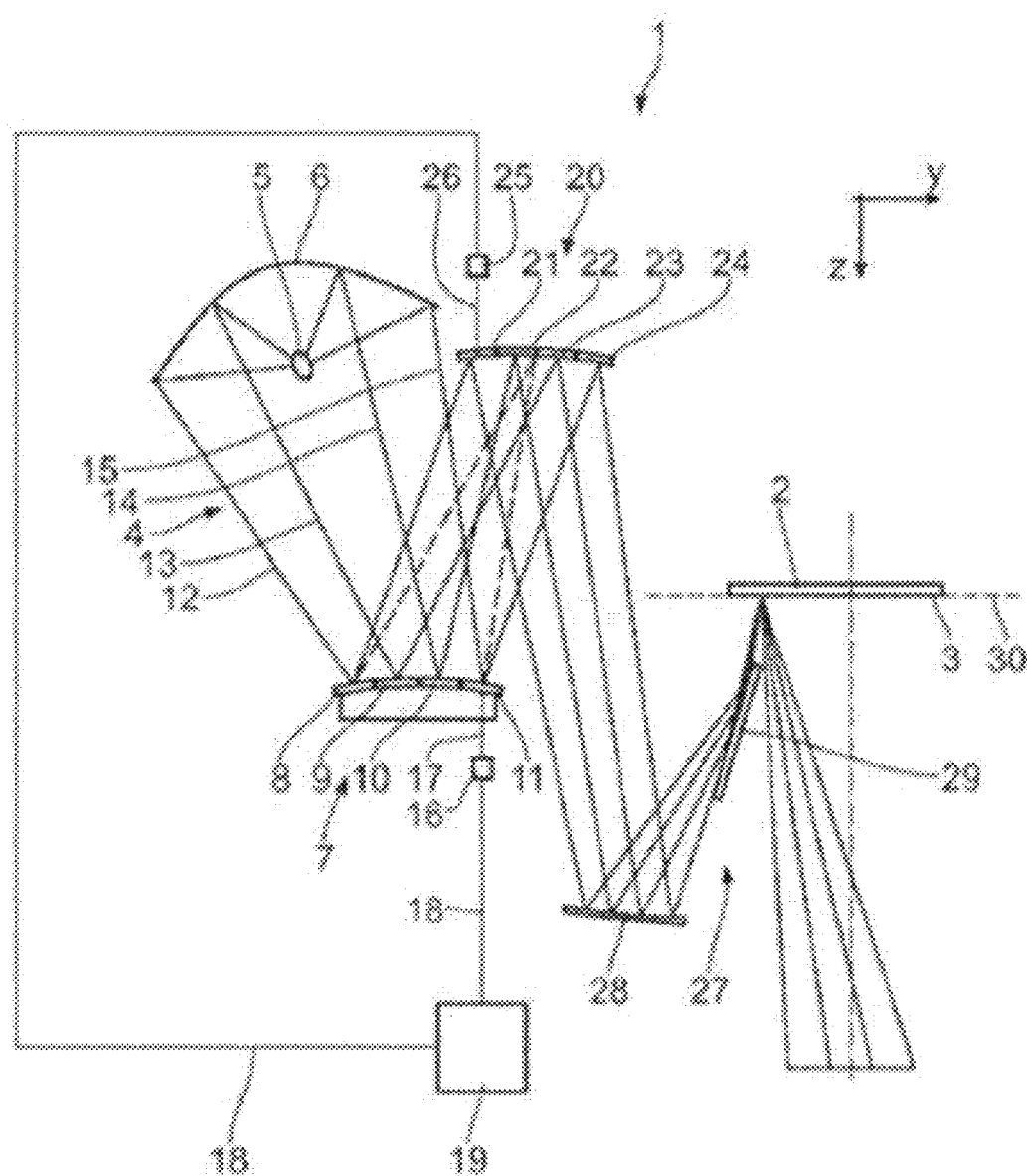
FIG. 1 is a configuration diagram of an EUV lighting device according to a conventional art.
Figure 2:
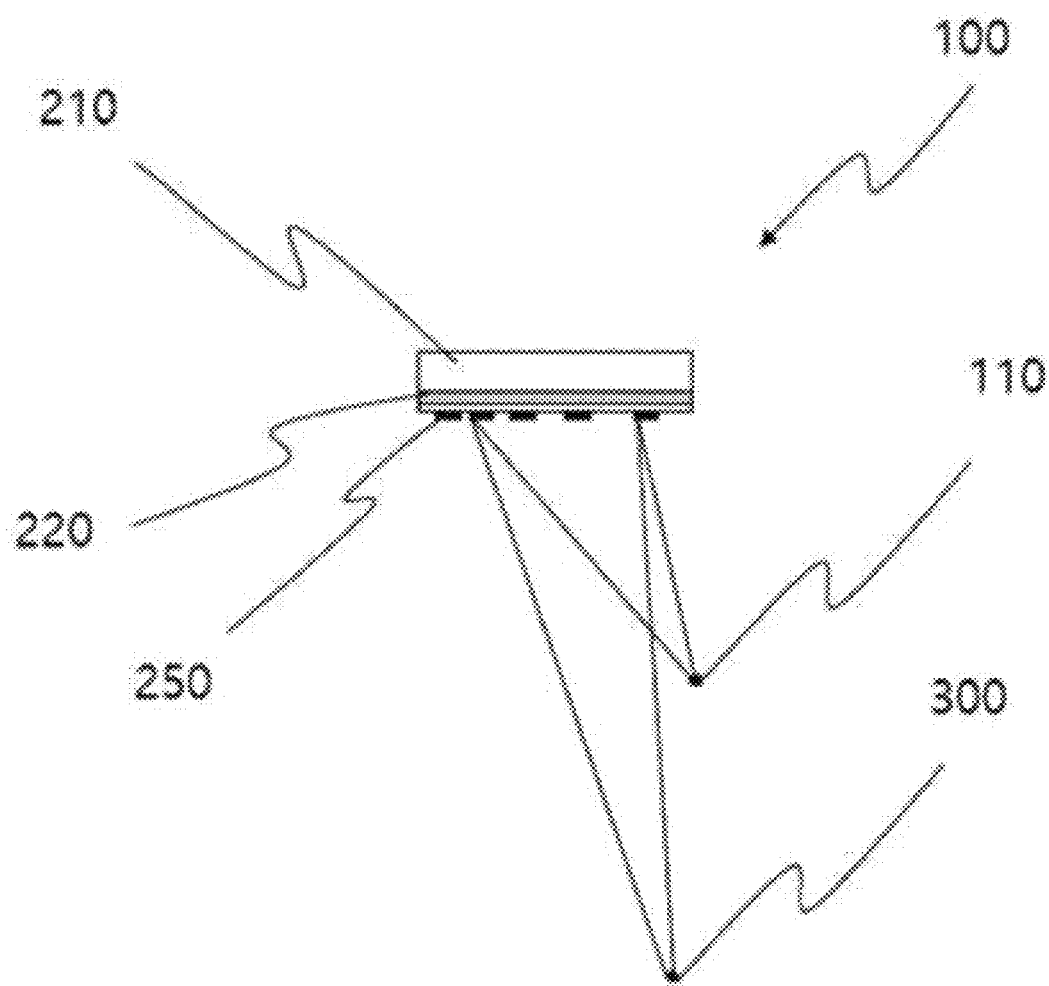
FIG. 2 is a configuration diagram of an EUV lighting device using a multilayer reflection zone plate according to the present invention.

FIG. 2 is a configuration diagram of the EUV lighting device using the multilayer reflection zone plate according to the present invention.

The EUV lighting device 100 using the multilayer reflection zone plate 200 according to the present invention is characterized by forming an EUV reflection multilayer film 220 as a planar substrate, forming a zone plate pattern 250 on the EUV reflection multilayer film 220, radiating EUV light output from the EUV light source 100 to the zone plate 200, and using reflected light as illumination light 300.

The EUV lighting device 100 according to the present invention is to provide a lighting device used for metrology and inspection of an EUV mask in an EUV exposure process of a semiconductor device manufacturing process, and includes one EUV light source 110, and a multilayer reflection zone plate 200 for creating EUV illumination light. The EUV light source 110 is preferably a light source for outputting extreme ultraviolet (EUV) light with a wavelength ranging from 5 nm to 15 nm.

As a main technical point of the present invention, the multilayer reflection zone plate 200 which is a reflector for creating EUV illumination light is formed in such a way that an EUV reflection multilayer film is stacked on the planar substrate 210 and a zone plate pattern 250 is formed on the EUV reflection multilayer film. Therefore, the multilayer reflection zone plate acquires $1^{st}$ diffraction light reflected after EUV light output from the EUV light source 110 is radiated to the multilayer reflection zone plate, and creates EUV illumination light 300.

Figure 3:
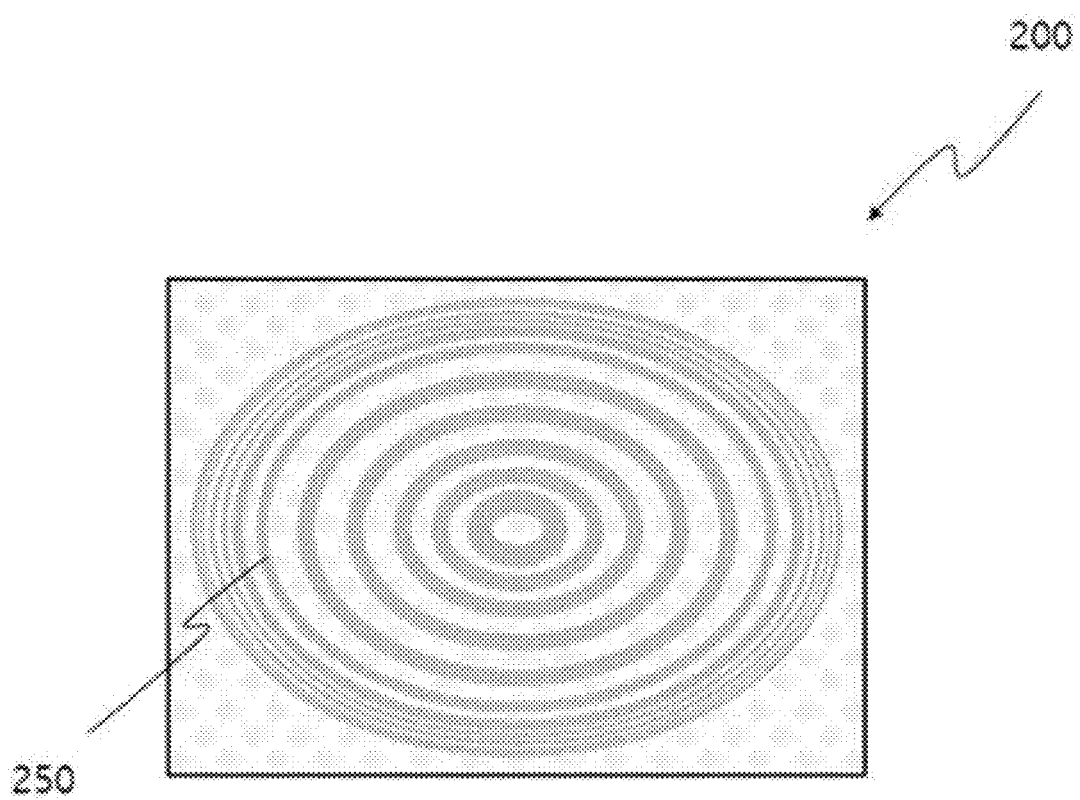
FIG. 3 is a plan view of the EUV lighting device using the multilayer reflection zone plate according to the present invention.

FIG. 3 is a plan view of the EUV lighting device using the multilayer reflection zone plate according to the present invention. As illustrated in FIG. 3, the multilayer reflection zone plate 200 for creating EUV illumination light used in the present invention is characterized in that the EUV reflection multilayer film is stacked on the planar substrate, and a zone plate pattern is formed on the EUV reflection multilayer film. The multilayer reflection zone plate according to the present invention has a circular or oval zone plate pattern 250. Through the zone plate pattern, $1^{st}$ diffraction light which is used as EUV illumination light is created.

In this instance, an absorber for forming the zone plate pattern 250 blocks reflection of all lights or reflects some of lights, and can control features of illumination light by controlling reflection of light.

Here, if the height or width or duty cycle of the zone plate pattern is adjusted at each position of the multilayer reflection zone plate 200, $1^{st}$ light efficiency is adjusted at the position. If the $1^{st}$ light diffraction efficiency is adjusted at each position to be a desired amount, the zone plate pattern 250 is lighted since beam is connected by a periodic structure, and intensity of the connected beam by angle is adjusted so as to form intensity distribution of illumination beam by angle like the EUV exposure machine.

Furthermore, it is also possible to uniformly adjust intensity distribution of illumination beam by adjusting $1^{st}$ light efficiency by position of the multilayer reflection zone plate. Such technology is very effective in improvement of EVU inspection performance.

Figure 4:
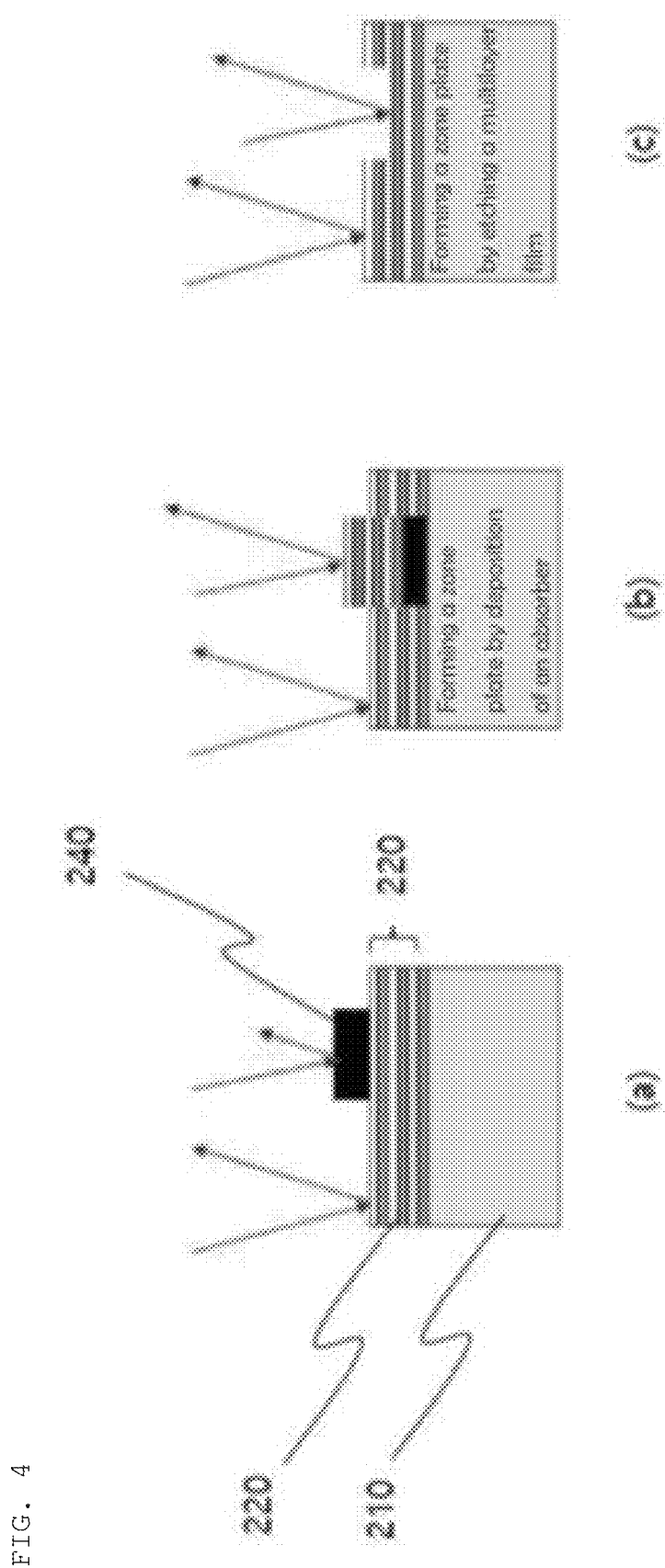
FIG. 4 is a sectional view illustrating various examples of the EUV lighting device using the multilayer reflection zone plate according to the present invention.

FIG. 4 is a sectional view illustrating various examples of the EUV lighting device using the multilayer reflection zone plate according to the present invention.

There are various methods to form the multilayer reflection zone plate according to the present invention. As illustrated in FIG. 4(a), an EUV reflection multilayer film 220 for forming a multilayer reflection film is stacked on one planar substrate 210, a plurality of absorbers 240 are formed on the surface of the EUV reflection multilayer film 220 so as to form a zone plate pattern. That is, one zone plate pattern is formed by the plurality of absorbers.

In this instance, the EUV reflection multilayer film is formed in such a way that at least two or more reflective materials are stacked repeatedly, and the absorbers 240 can be controlled to absorb incident light or to reflect some of the incident light.

FIG. 4(*b*) illustrates a structure that the EUV reflection multilayer film is etched and the absorbers are formed on the etched EUV reflection multilayer film, so that a zone plate pattern is formed on the inner surface of the multilayer film. In the case of FIG. 4(*a*), a zone plate pattern is formed on the surface of the multilayer film.

FIG. 4(*c*) illustrates that the EUV reflection multilayer film is etched along a predetermined pattern and a zone plate pattern is formed on the etched EUV reflection multilayer film.

The absorber 240 for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

Figure 5:
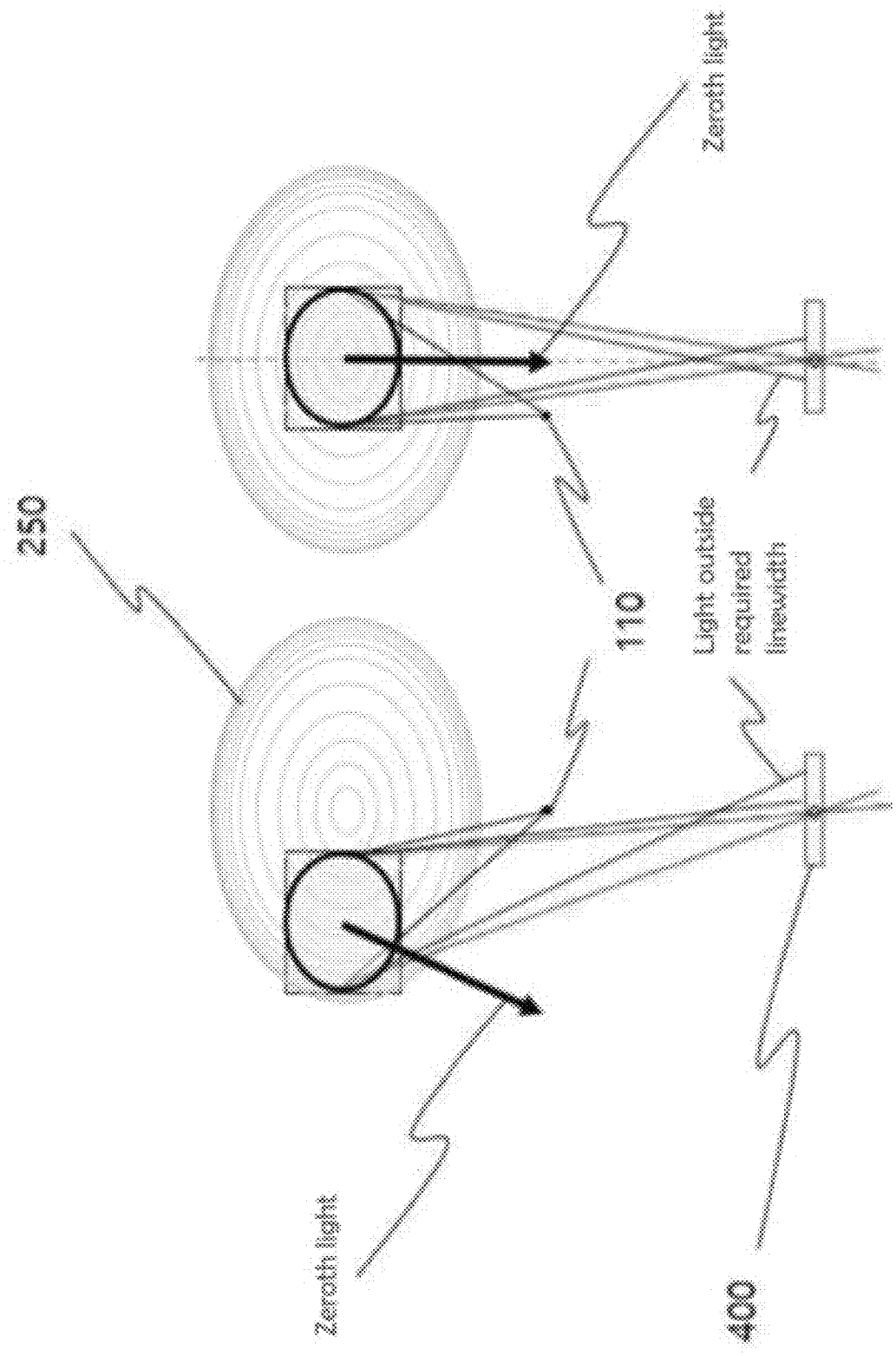
FIG. 5 is a view illustrating a lighting method of the EUV lighting device using the multilayer reflection zone plate according to the present invention.

FIG. 5 is a view illustrating a lighting method of the EUV lighting device using the multilayer reflection zone plate according to the present invention.

The zone plate pattern on the multilayer reflection zone plate 200 is formed in a circular or oval shape to collect the EUV light source to a sample. The zone plate may be an off-axis zone plate that the center of the circular or oval pattern does not exist in the multilayer reflection zone plate or an on-axis zone plate that the center of the circular or oval pattern exists in the multilayer reflection zone plate.

In the case of the off-axis zone plate, the center of zeroth light and the center of first light head in different directions, and in the case of the on-axis zone plate, the center of zeroth light and the center of first light are in the same direction. In order to obtain effect to narrow a broad wavelength linewidth of EUV light, an aperture 400 is formed around the collected illumination beam. In this instance, the off-axis zone plate is narrower in linewidth of monochromatic light than the on-axis zone plate since being combined with the aperture, but is shorter in required pattern cycle than the on-axis zone plate. Accordingly, it is possible to select one among the off-axis zone plate and the on-axis zone plate according to the linewidth of light sources and purposes of illumination beam.

If the linewidth of the wavelength of the EUV light source is broad, an aperture is added to create monochromatic light with narrow wavelength line width. The EUV light source used in the EUV lighting device according to the present invention uses EUV light having a wavelength area ranging from 5 nm to 15 nm. Some of users call light near 13.5 nm wavelength EUV light, and call light near 6.7 nm wavelength beyond EUV (BUV) light. In the present invention, wavelength ranging from 5 nm to 15 nm is designated as EUV light.

The EUV light source uses light which is created from plasma generated when Nd:YAG laser or CO2 laser is collected to a Sn or Xe target or is generated from a synchrotron. The present invention provides all technologies applicable to the created EUV light as well as the above-mentioned technology.

Figure 6:
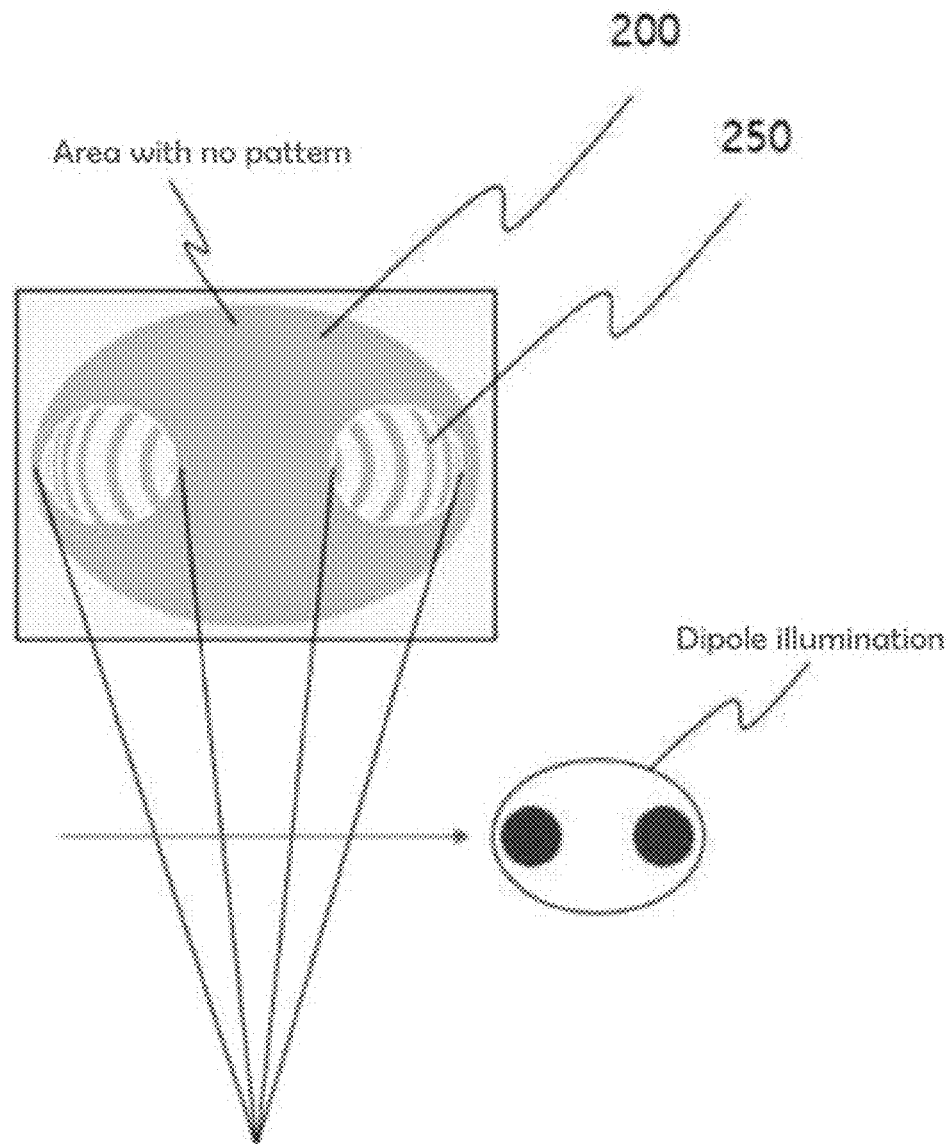
FIG. 6 is a view illustrating another lighting method of the EUV lighting device using the multilayer reflection zone plate according to the present invention.

FIG. 6 is a view illustrating another lighting method of the EUV lighting device using the multilayer reflection zone plate according to the present invention. The multilayer reflection zone plate determines whether or not diffraction of light exists by spatially adjusting whether or not a zone plate pattern exists on the multilayer reflection zone plate so as to embody binary illumination, and the binary illumination is applied to an EUV microscope so as to confirm optimization conditions for improving resolution of the microscope. Therefore, the binary illumination can be applied to be optimized in inspection sensitivity improvement of an inspection machine.

Figure 7:
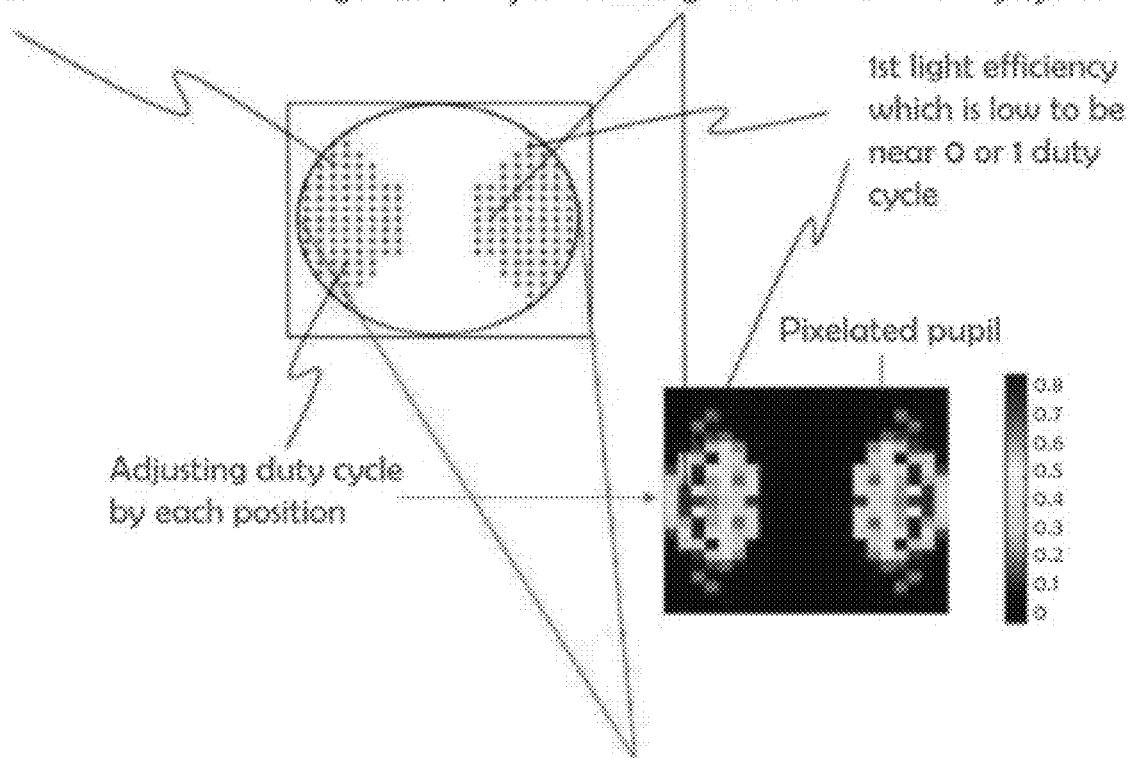
FIG. 7 is a detailed configuration diagram illustrating illumination light control of the EUV lighting device using the multilayer reflection zone plate according to the present invention.

FIG. 7 is a detailed configuration diagram illustrating illumination light control of the EUV lighting device using the multilayer reflection zone plate according to the present invention. When a duty cycle of a zone plate pattern or the height of absorber is spatially adjusted on the multilayer reflection zone plate, intensity of $1^{st}$ diffraction light in the spatial part is adjusted so as to embody freeform pupil illumination or pixelated pupil illumination. The freeform pupil illumination is applied to be optimized in improvement of resolution of a microscope or improvement of inspection sensitivity of an inspection machine, or the freeform pupil illumination is optimized to improve uniformity of beam radiated to a sample.

Furthermore, in FIG. 7, a pattern is formed intermittently or a part where there is no pattern is formed so that diffraction light is formed only at parts where the pattern is formed so as to light a desired point, and the duty cycle of the pattern at an appropriate part is adjusted to control the brightness of illumination at the desired point.

Such a zone plate is utilized in determining whether or not diffraction of light exists by spatially adjusting whether or not a zone plate pattern exists on the multilayer reflection zone plate so as to embody binary illumination. The duty cycle at the place where the zone plate pattern exists is varied to control the quantity of light at the binary illumination position, so that the position to which illumination is lighted and intensity of light of illumination can be adjusted so as to provide desired illumination to a desired part.

Figure 8:
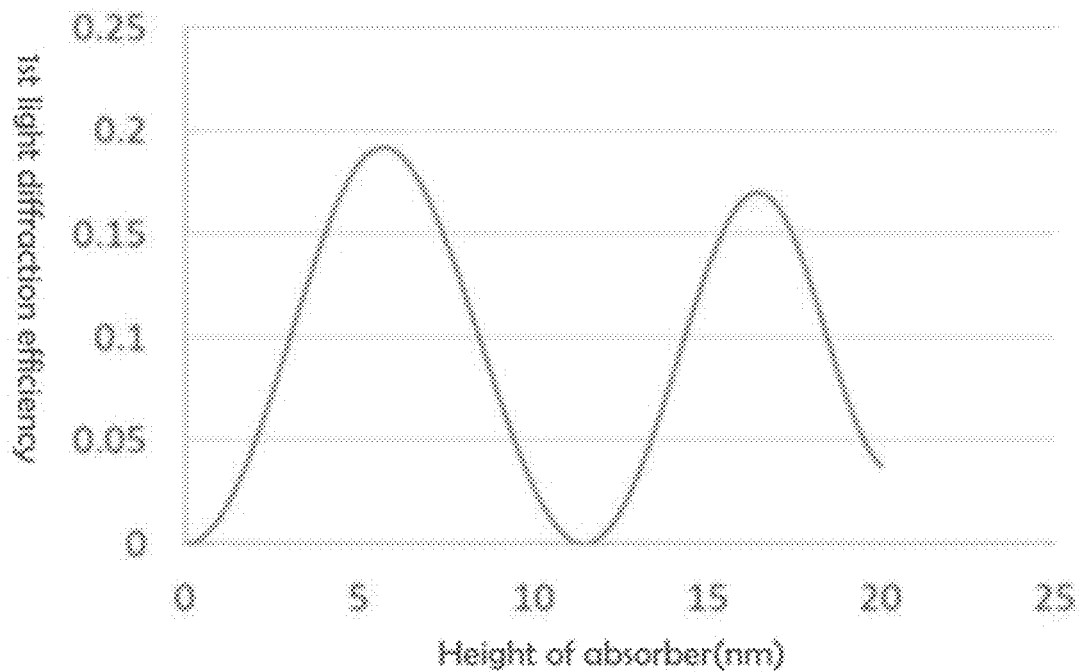
FIG. 8 is a view illustrating the result that $1^{st}$ ray diffraction ($1^{st}$ diffraction light intensity) according to the height of an absorber of the lighting device according to the present invention was calculated.

FIG. 8 is a view illustrating the result that $1^{st}$ ray diffraction ($1^{st}$ diffraction light intensity) according to the height of absorber of the lighting device according to the present invention was calculated. In this instance, the pitch of the used zone plate pattern is 300 nm, the duty cycle (DC) is 0.5, and the wavelength of the applied illumination is 13.5 nm. The absorber exists below the multilayer film. When the height of the absorber is about 8 nm, the $1^{st}$ light diffraction efficiency is about 19% to the maximum.

Figure 9:
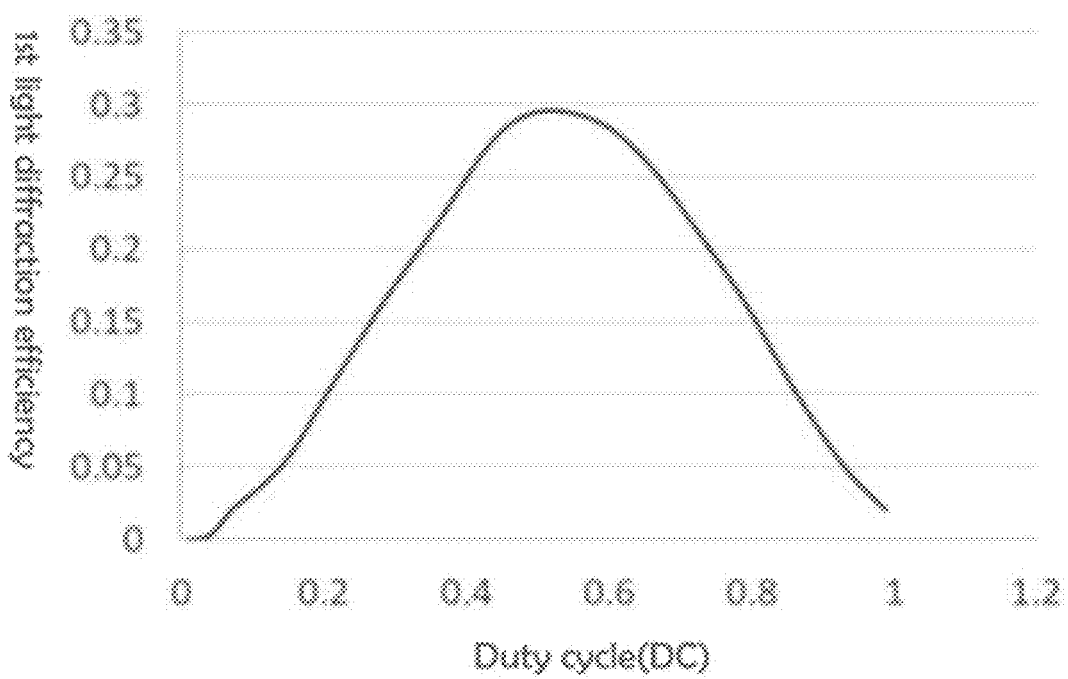
FIG. 9 is a view illustrating the result that an intensity change in $1^{st}$ diffraction rays for forming freeform pupil illumination of the lighting device according to the present invention was calculated.

FIG. 9 is a view illustrating the result that an intensity change in $1^{st}$ diffraction rays for forming freeform pupil illumination of the lighting device according to the present invention was calculated. In this instance, the pitch of the used zone plate pattern is 300 nm, and $1^{st}$ light diffraction efficiency is obtained at each duty cycle with the wavelength of 13.5 nm. The maximum $1^{st}$ light efficiency of about 29% can be obtained when the duty cycle is about 0.55. Compared with the existing optical system (=0.65^5=0.11, up to 11%) to which the EUV multilayer is applied and which has five EUV mirror, an optical device which is formed by freeform pupil shows considerably high efficiency. The efficiency difference between the conventional art and the present invention can be varied according to kinds of freeform pupil.

Here, the duty cycle means a ratio between the width at the part where a pattern is formed and the width at the part where a pattern is not formed (Duty cycle=(width at the part where a pattern is formed)/cycle assuming that there is a virtual line in the perpendicular direction on the zone plate pattern, wherein the cycle means the sum of the width at the part where a pattern is formed and the width at the part where a pattern is not formed.

Therefore, referring to FIG. 9, it is found out that efficiency of the $1^{st}$ diffraction light is obtained according to duty cycle values of the transverse axis and that the duty cycle value ranges from 0.4 to 0.6, preferably, 0.25 to 0.3.

Figure 10:
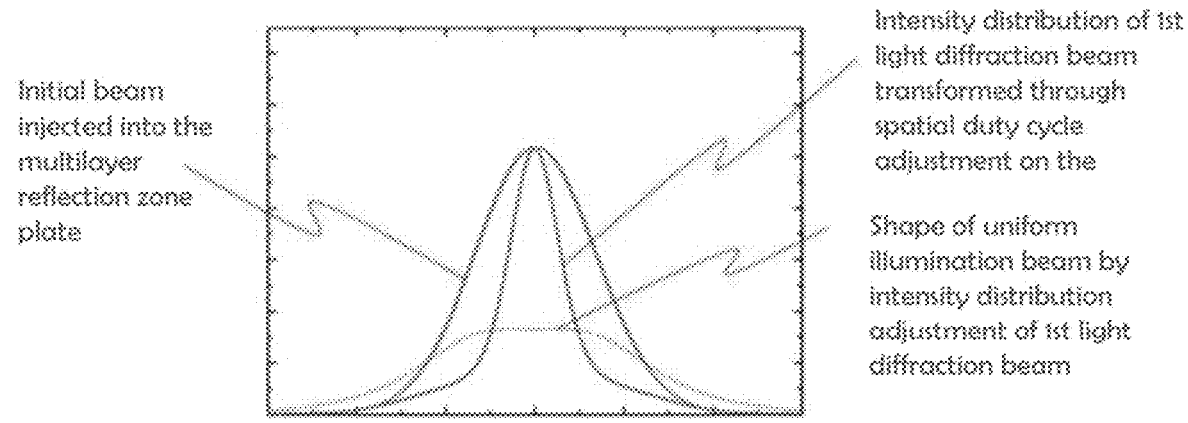
FIG. 10 is a view illustrating the result that intensity distribution of $1^{st}$ diffraction beams is optimized through a spatial duty cycle control in a multilayer reflection zone plate pattern of the lighting device according to the present invention.

FIG. 10 is a view illustrating the result that intensity distribution of $1^{st}$ diffraction beams is optimized through a spatial duty cycle control in a multilayer reflection zone plate pattern of the lighting device according to the present invention. When gaussian beam was radiated to the multilayer reflection zone plate and intensity distribution of beam first diffracted through a spatial duty cycle adjustment was transformed, the lighting device according to the present invention could improve uniformity near the center more than the existing gaussian beam. Therefore, uniformity of illumination beam applied for inspection can be improved regardless of existence of an optical system.

The multilayer reflection zone plate according to the present invention is easily applicable to a device since being smaller in number of components than the existing optical system using mirrors, and has a short development period of time and requires low expenses since being small in number of components.

Because the reflection zone plate not to which the existing oblique incidence reflection zone plate parts are applied does not have the multilayer film, beam is injected into the zone plate at oblique incidence (at an incidence angle of 86 degrees) for soft ray reflection and solid angles collected to the zone plate are small. Therefore, the present invention can solve the problem that light harvesting efficiency is deteriorated.

Although the present invention has been described in connection with the preferred embodiment for illustrating the principle of the present invention, the present invention is not limited to the aforementioned specific embodiment. It will be appreciated to those skilled in the art that the present invention can be changed and modified in various manners without departing from the spirit and scope of the present invention. Accordingly, all proper changes, modifications, and equivalents should be construed as belonging to the scope of the present invention.

What is claimed is:

1. An extreme ultraviolet (EUV) lighting device, comprising:
    an EUV light source for outputting EUV light; and
    a multilayer reflection zone plate comprising a substrate, a multilayer film stacked on an entire one surface of the substrate to reflect the EUV light radiated from the EUV light source, and a zone plate pattern for creating EUV illumination light by diffracting the reflected EUV light,
    wherein the zone plate pattern includes a plurality of absorbers formed along a predetermined pattern formed on a surface or an inner face of the multilayer film,
    wherein the EUV lighting device uses the multilayer reflection zone plate for metrology and inspection of an EUV mask used in an EUV exposure process of a semiconductor device manufacturing process.

2. The EUV lighting device according to claim 1, wherein the EUV light has a wavelength ranging from 5 nm to 15 nm.

3. The EUV lighting device according to claim 1, wherein the multilayer film of the multilayer reflection zone plate is formed by at least two or more reflective materials stacked.

4. The EUV lighting device according to claim 1, wherein the zone plate pattern of the multilayer reflection zone plate is formed in such a way that at least a part of the multilayer film is etched along the predetermined pattern.

5. The EUV lighting device according to claim 1, wherein the zone plate pattern of the multilayer reflection zone plate has a height or a width adjusted to obtain a desired diffraction efficiency of the EUV light.

6. The EUV lighting device according to claim 1, wherein the zone plate pattern of the multilayer reflection zone plate has a circular or oval shape.

7. The EUV lighting device according to claim 6, wherein the zone plate pattern of the multilayer reflection zone plate is an off-axis zone plate that the center of the circular or oval pattern does not exist in the multilayer reflection zone plate or is an on-axis zone plate that the center of the circular or oval pattern exists in the multilayer reflection zone plate.

8. The EUV lighting device according to claim 1, further comprising:
    an aperture for limiting a linewidth of the illumination light collected from the multilayer reflection zone plate.

9. A manufacturing method of an extreme ultraviolet (EUV) lighting device for metrology and inspection of an EUV mask used in an EUV exposure process of a semiconductor device manufacturing process, the manufacturing method comprising the steps of:
    (A) arranging an EUV light source which outputs EUV light; and
    (B) manufacturing a multilayer reflection zone plate,
    wherein the step (B) comprises the steps of:
    (B-i) arranging a substrate;
    (B-ii) stacking a multilayer film for reflecting the EUV light radiated from the EUV light source on an entire one surface of the substrate; and
    (B-iii) forming a zone plate pattern, which creates EUV illumination light by diffracting the reflected EUV light, on the multilayer film,
    wherein the step (B-iii) comprises the step of:
    (B-iii-1) forming a plurality of absorbers on the surface of the multilayer film in a predetermined pattern in order to form the zone plate pattern; or
    (B-iii-2) etching the multilayer film in a predetermined pattern and forming one of the plurality of absorbers on the etched part in order to form the zone plate pattern; or
    (B-iii-3) etching at least a part of the multilayer film in a predetermined pattern in order to form the zone plate pattern.

10. The manufacturing method according to claim 9, wherein in the step (B-ii), at least two or more reflective materials are stacked on the substrate to form the multilayer film.

11. The manufacturing method according to claim 9, wherein the step of forming the absorber in the predetermined pattern or etching the multilayer film in the predetermined pattern is realized through E-beam lithography.

* * * * *